United States Patent
Tokunaga et al.

(10) Patent No.: US 7,388,405 B2
(45) Date of Patent: Jun. 17, 2008

(54) SIGNAL TRANSMISSION CIRCUIT

(75) Inventors: Yusuke Tokunaga, Osaka (JP); Shiro Sakiyama, Osaka (JP); Shiro Dosho, Osaka (JP); Yasuyuki Doi, Kyoto (JP); Makoto Hattori, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 133 days.

(21) Appl. No.: 11/513,239

(22) Filed: Aug. 31, 2006

(65) Prior Publication Data

US 2007/0090859 A1 Apr. 26, 2007

(30) Foreign Application Priority Data

Oct. 20, 2005 (JP) ............... 2005-305526

(51) Int. Cl.
  *H03K 19/094* (2006.01)
  *H03K 19/0175* (2006.01)
  *H03B 1/00* (2006.01)
(52) U.S. Cl. ................... 326/83; 326/68; 326/87; 327/108; 375/295
(58) Field of Classification Search ............ 326/68, 326/82, 83, 86, 87; 327/108, 109
  See application file for complete search history.

(56) References Cited

U.S. PATENT DOCUMENTS

| | | | |
|---|---|---|---|
| 5,661,415 A | 8/1997 | Aoki et al. | |
| 6,005,413 A * | 12/1999 | Schmitt | 326/80 |
| 6,118,303 A * | 9/2000 | Schmitt et al. | 326/83 |
| 6,459,314 B2 | 10/2002 | Kim | |
| 6,624,670 B2 | 9/2003 | Payne et al. | |
| 6,661,259 B2 | 12/2003 | Tsuchi | |
| 7,292,073 B2 * | 11/2007 | Khan et al. | 327/108 |

FOREIGN PATENT DOCUMENTS

JP    6-45547    2/1994

\* cited by examiner

*Primary Examiner*—Rexford Barnie
*Assistant Examiner*—Dylan White
(74) *Attorney, Agent, or Firm*—McDermott Will & Emery LLP

(57) ABSTRACT

A time required for an output voltage of a source follower to rise from Low to a predetermined voltage depends on a bias voltage. Therefore, by setting a converged voltage of an output voltage to be high by increasing the bias voltage, the time required to rise up to the predetermined voltage can be reduced. Therefore, a first source follower which is biased so that the converged value of the output voltage becomes a predetermined Hi voltage when an input data signal goes from Low to Hi, and a second source follower which is biased so as to become the Hi voltage after a period of one clock when an input data signal goes from Low to Hi, are used. The two source followers are operated with appropriate timing.

8 Claims, 14 Drawing Sheets

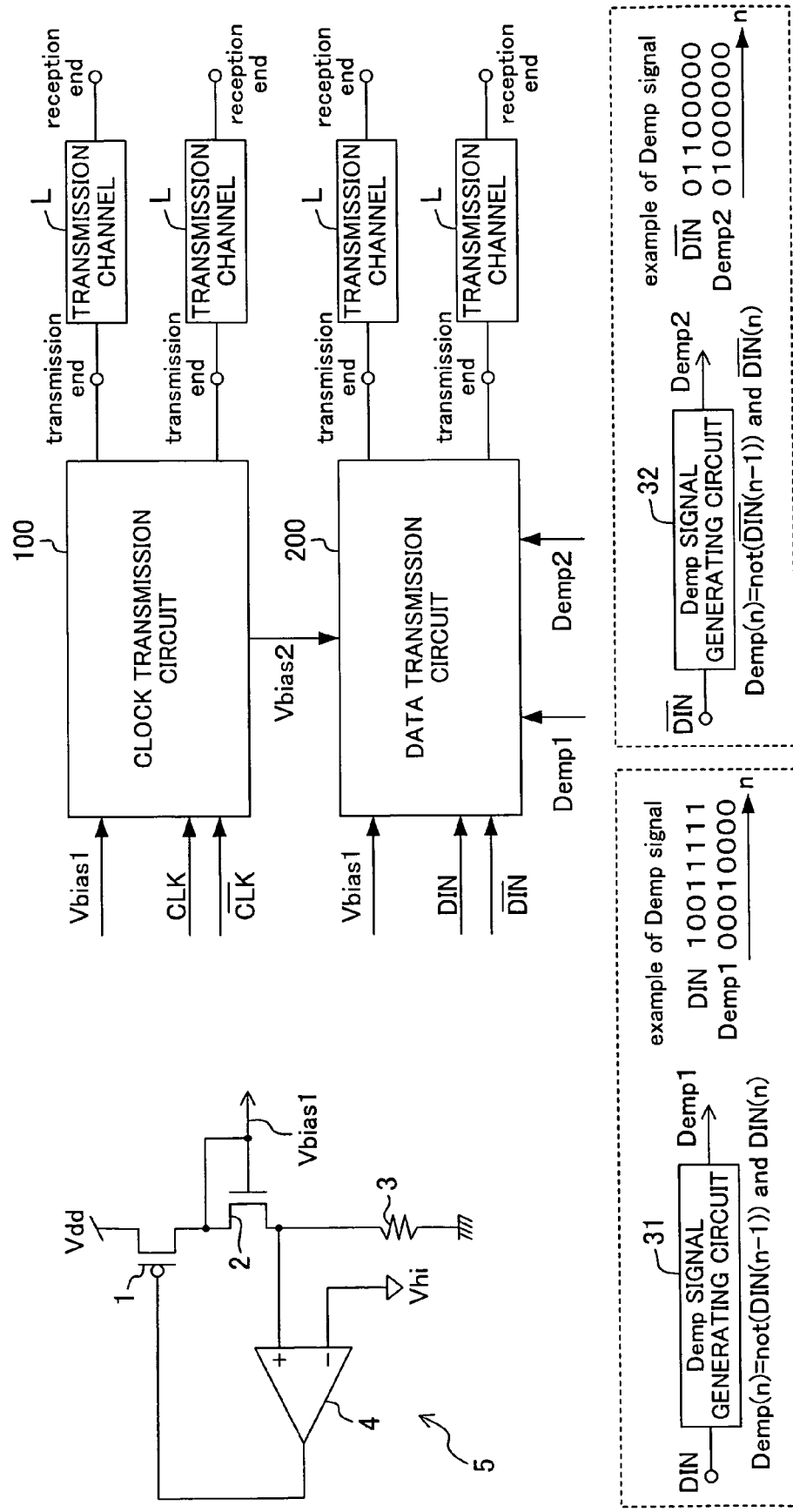

SIGNAL TRANSMISSION CIRCUIT

BACKGROUND OF THE INVENTION

1. Field of the Invention

The present invention relates to a technique for signal transmission between, for example, semiconductor integrated circuits.

2. Description of the Related Art

Conventionally, a voltage-mode circuit employing a single source follower is known as a signal transmission circuit having low power consumption and a low amplitude (see JP No. 6-45547 A).

There is another conventional technique in which an output buffer circuit is composed of two N-channel MOS transistors constituting a push-pull structure, and a NOR circuit which feeds an output signal back to a pull-up transistor so as to obtain an output signal having a low amplitude and a high speed (see U.S. Pat. No. 5,661,415).

Also, there is a known technique of adding an edge emphasis circuit to a high-speed voltage-mode differential output driver (see U.S. Pat. No. 6,624,670).

In the conventional circuit employing a single source follower, when a logical high voltage (Hi voltage) is transmitted, the gate-source voltage of an N-channel MOS transistor included in the source follower decreases to the threshold voltage of the N-channel MOS transistor, disadvantageously resulting in a reduction in drive performance and a reduction in transmission rate.

SUMMARY OF THE INVENTION

An object of the present invention is to provide a signal transmission circuit which overcomes the conventional drive performance reduction problem, and can perform high-speed transmission while holding low power consumption of voltage-mode transmission.

To achieve the object, the present invention provides a signal transmission circuit for driving a transmission channel in a voltage mode, comprising first and second source followers each composed of a MOS transistor, a first bias circuit for applying a first bias voltage to the first source follower, a second bias circuit for applying a second bias voltage different from the first bias voltage to the second source follower, and a circuit for generating an emphasis data signal indicating a period of one clock from a time when an input data signal goes from a first logical value to a second logical value, in which the first source follower drives the transmission channel, depending on the input data signal, and the second source follower drives the transmission channel, depending on the emphasis data signal.

In general, the output voltage of a source follower and a time required for transition thereof depend on a bias voltage. Therefore, according to the present invention, first and second source followers to which different bias voltages are applied are provided, and the first source follower, which is operated with low speed, is operated, depending on an input data signal, and the second source follower, which is operated with high speed, is operated, depending on an emphasis data signal, thereby making it possible to drive a transmission channel in a voltage-mode with high speed.

BRIEF DESCRIPTION OF THE DRAWINGS

FIG. 3 is a block diagram illustrating a configuration of a signal transmission circuit according to a second embodiment of the present invention.

DETAILED DESCRIPTION OF THE PREFFERED EMBODYMENTS

Hereinafter, embodiments of the present invention will be described with reference to the accompanying drawings.

First Embodiment

Figure 1:
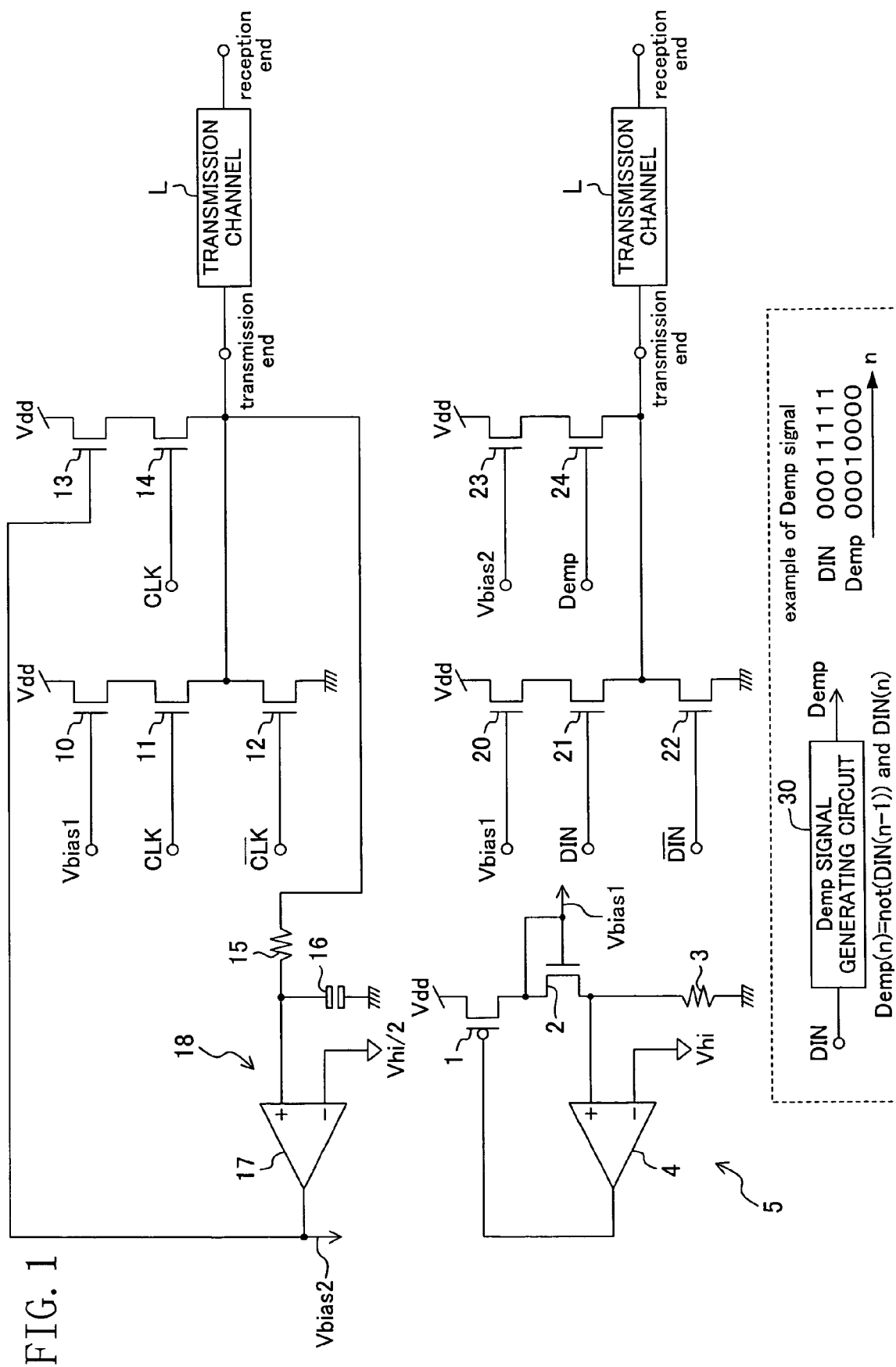
FIG. 1 is a circuit diagram illustrating a configuration of a signal transmission circuit according to a first embodiment of the present invention.

FIG. 1 illustrates a configuration of a signal transmission circuit according to a first embodiment of the present invention. The signal transmission circuit of FIG. 1 is a single-end output type circuit having a clock transmission circuit for transmitting a clock signal to a corresponding transmission channel L and a data transmission circuit for transmitting a data signal to a corresponding transmission channel L. Each transmission channel L is driven in a voltage mode.

The clock transmission circuit comprises first and second source followers 10 and 13 each composed of an N-channel MOS transistor, and first, second and third switching transistors 11, 12 and 14 each composed of an N-channel MOS transistor. The drain of the first source follower 10 is connected to a power supply Vdd, and the source of the first source follower 10 is connected via the first switching transistor 11 to a transmission end. The drain of the second source follower 13 is connected to the power supply Vdd, and the source of the second source follower 13 is connected via the third switching transistor 14 to the transmission end. The transmission end is connected via the second switching transistor 12 to the ground. A first bias voltage Vbias1 is applied to the gate of the first source follower 10, and a second bias voltage Vbias2 which is different from Vbias1 is applied to the gate of the second source follower 13. A clock (CLK) signal is supplied to the gates of the first and third switching transistors 11 and 14, and an inverted clock signal is supplied to the gate of the second switching transistor 12.

The data transmission circuit comprises first and second source followers 20 and 23 each composed of an N-channel MOS transistor, and first, second and third switching transistors 21, 22 and 24 each composed of an N-channel MOS transistor. The drain of the first source follower 20 is connected to the power supply Vdd, and the source of the first source follower 20 is connected via the first switching transistor 21 to a transmission end. The drain of the second source follower 23 is connected to the power supply Vdd, and the source of the second source follower 23 is connected via the third switching transistor 24 to the transmission end. The transmission end is connected via the second switching transistor 22 to the ground. Vbias1 is applied to the gate of the first source follower 20, and Vbias2 is applied to the gate of the second source follower 23. An input data (DIN) signal is supplied to the gate of the first switching transistor 21, an inverted input data signal is supplied to the gate of the second switching transistor 22, and an emphasis data (Demp) signal is supplied to the gate of the third switching transistor 24. Specifically, the first source follower 20 drives the transmission channel L, depending on the DIN signal, and the second source follower 23 drives the transmission channel L, depending on the Demp signal. Note that the DIN signal is a serial data signal which is in synchronization with the CLK signal.

In FIG. 1, a first bias circuit 5 for generating Vbias1 and a second bias circuit 18 for generating Vbias2 are further illustrated. The first bias circuit 5 is composed of a single P-channel MOS transistor 1, a single N-channel MOS transistor 2, a single resistance 3, and a single differential amplifier 4. The inverted input of the differential amplifier 4 is fixed to a previously set transmission-end Hi voltage (Vhi). The second bias circuit 18 is composed of a resistance 15 and a capacitance 16 for detecting an average value of a transmission-end voltage of the clock transmission circuit, and a single differential amplifier 17. The inverted input of the differential amplifier 17 is fixed to a half voltage of Vhi.

The first bias circuit 5 determines Vbias1 so that the output voltages of the first source followers 10 and 20 are converged to Vhi when the DIN signal goes from Low to Hi. On the other hand, the second bias circuit 18 determines Vbias2 so that a half of Vhi which is the converged value of the output voltage of the first source followers 10 and 20 when the DIN signal goes from Low to Hi, becomes equal to the average value of the output voltage of the clock transmission circuit. Thus, Vbias1 and Vbias2 are determined so that the converged value of the output voltage of the first source followers 10 and 20 when the DIN signal goes from Low to Hi, becomes substantially equal to the output voltage of the second source followers 13 and 23 at the time when a period of one clock has passed since the DIN signal went from Low to Hi.

FIG. 1 also illustrates a Demp signal generating circuit 30 for generating an emphasis data (Demp) signal. The Demp signal generating circuit 30 generates a Demp signal indicating a period of one clock from the time when the DIN signal goes from Low (logical value 0) to Hi (logical value 1) by:

Demp($n$)=not(DIN($n$−1)) and DIN($n$).

In other words, the Demp signal goes to Hi only a period of a first one clock of a continuous Hi period of an input data signal sequence DIN(n).

Figure 2A:
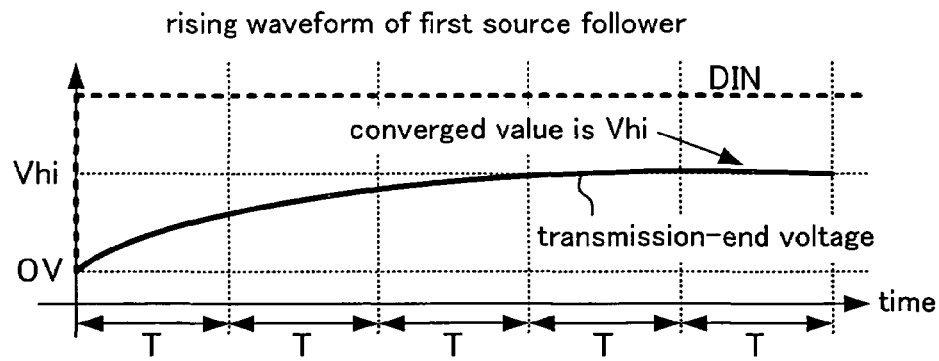
FIGS. 2A, 2B and 2C are signal waveform diagrams for explaining an effect of the signal transmission circuit of FIG. 1.
Figure 2B:
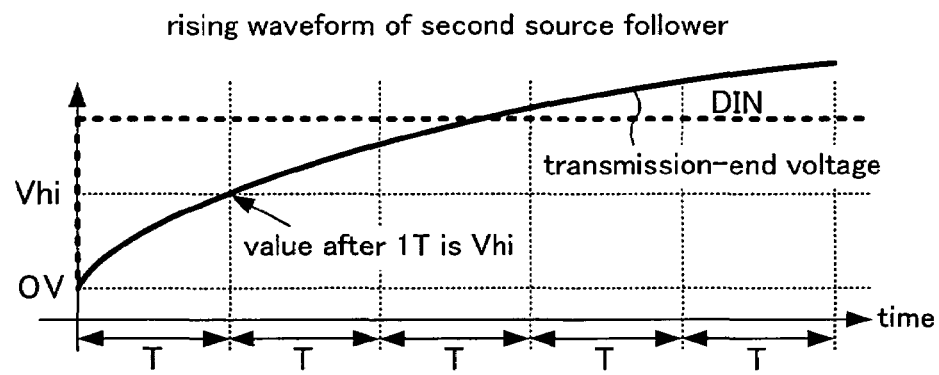
Figure 2C:
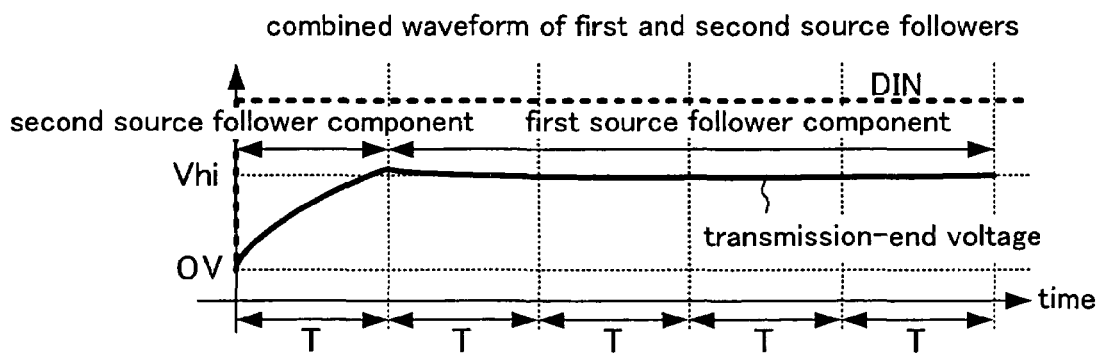

FIGS. 2A, 2B and 2C are signal waveform diagrams for explaining an effect of the signal transmission circuit of FIG. 1. FIG. 2A illustrates a rising waveform of the first source follower 20, and FIG. 2B illustrates a rising waveform of the second source follower 23. Here, one cycle of the CLK signal, i.e., the length of a period of one clock, is represented by T.

As can be seen from FIG. 2A, the output voltage of the first source follower 20 is converged to Vhi when the DIN signal goes from Low to Hi. The converged value Vhi is substantially equal to a difference between Vbias1 and the threshold voltage of the N-channel MOS transistor included in the first source follower 20. On the other hand, as can be seen from FIG. 2B, Vbias2 is adjusted so that the output voltage of the second source follower 23 at the time when a period of 1T has passed since the DIN signal went from Low to Hi, becomes Vhi. In general, the output voltage of a source follower and a time required for transition thereof depend on a bias voltage. Therefore, by setting Vbias2 to be a voltage value higher than Vbias1, the rising of the output voltage of the second source follower 23 is caused to be more rapid than that of the first source follower 20. Note that the driving of the data transmission end by the second source follower 23 is limited to a period of 1T from the time when the DIN signal goes from Low to Hi due to the Demp signal. As a result, a combined output waveform as illustrated in FIG. 2C is obtained, so that a high-speed output signal sequence which cannot be obtained by the conventional single source follower-driven signal transmission circuit can be obtained.

Note that the driving of the data transmission end by the first source follower 20 during a period of 1T from the time when the DIN signal goes from Low to Hi may be stopped, and the data transmission end may be driven only by the second source follower 23.

Second Embodiment

FIG. 3 illustrates a configuration of a signal transmission circuit according to a second embodiment of the present invention. This is obtained by changing the first embodiment into a differential output type. In FIG. 3, 100 indicates a clock transmission circuit having a differential output structure, and 200 indicates a data transmission circuit having a differential output structure. Also in FIG. 3, a Demp signal generating circuit 31 for generating an emphasis data (Demp1) signal for a positive phase circuit, and a Demp signal generating circuit 32 for generating an emphasis data (Demp2) signal for a reverse phase circuit, are illustrated. The Demp1 signal goes to Hi only for a period of a first one clock of a continuous Hi period of an input data signal sequence DIN(n), and the Demp2 signal goes to Hi only for a period of a first one clock of a continuous Hi period of a signal sequence which is an inversion of the input data signal sequence DIN(n). A first bias circuit 5 for generating Vbias1 has the same structure as that of FIG. 1.

Figure 4:
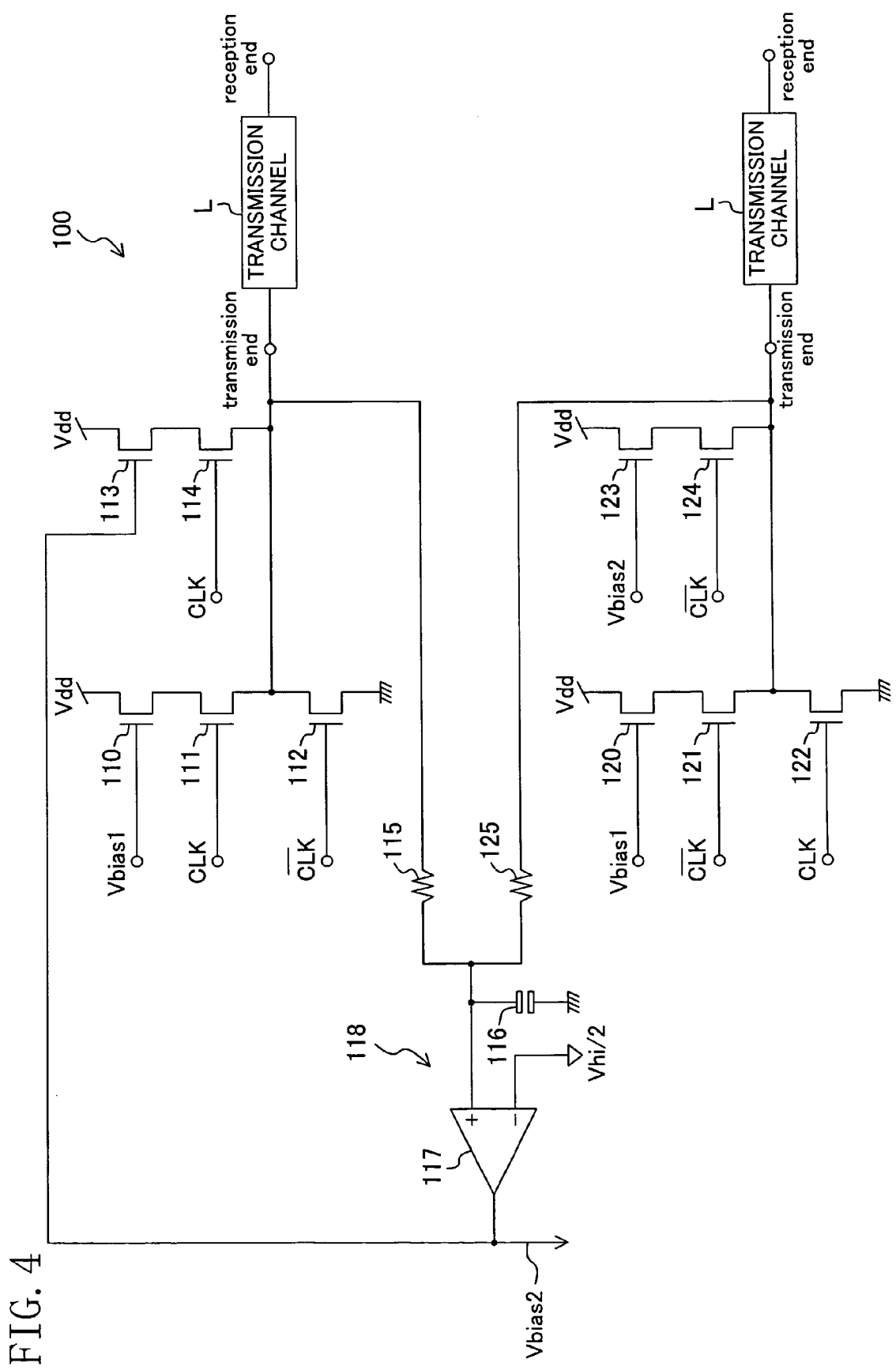
FIG. 4 is a circuit diagram illustrating a detailed configuration of a clock transmission circuit of FIG. 3.

FIG. 4 illustrates a detailed configuration of the clock transmission circuit 100 of FIG. 3. The positive phase circuit which responds to a CLK signal is composed of first and second source followers 110 and 113 and three switching transistors 111, 112 and 114. The reverse phase circuit which responds to an inverted CLK signal is composed of first and second source followers 120 and 123 and three switching transistors 121, 122 and 124. A second bias circuit 118 for generating Vbias2 is composed of resistances 115 and 125 and a capacitance 116 for detecting an average voltage using a transmission-end voltage of the positive phase circuit and a transmission-end voltage of the reverse phase circuit, and a single differential amplifier 117. The inverted input of the differential amplifier 117 is fixed to a half voltage of Vhi.

Figure 5:
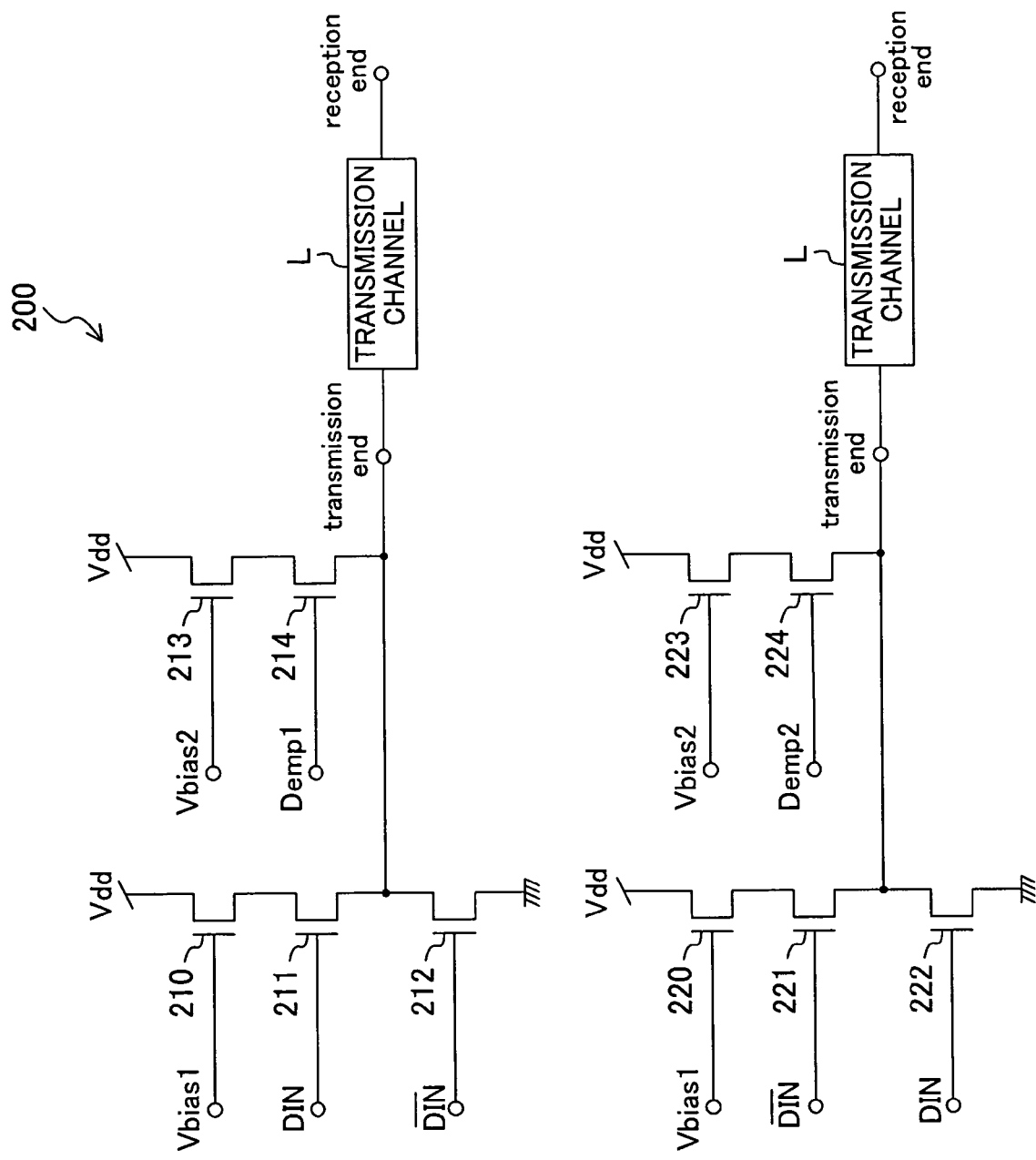
FIG. 5 is a circuit diagram illustrating a detailed configuration of a data transmission circuit of FIG. 3.

FIG. 5 illustrates a detailed configuration of the data transmission circuit 200 of FIG. 3. The positive phase circuit which responds to a DIN signal is composed of first and second source followers 210 and 213 and three switching transistors 211, 212 and 214. The reverse phase circuit which responds to an inverted DIN signal is composed of first and second source followers 220 and 223 and three switching transistors 221, 222 and 224.

According to the second embodiment, an effect similar to that of the first embodiment can be obtained using the differential output type.

Third Embodiment

When a differential signal having a transmission frequency which is higher than or equal to a transmission channel cut-off frequency is transmitted, a reduction in signal waveform amplitude due to the filter characteristics of the transmission channel is an important problem. A waveform which alternately switches between Hi and Low every 1T has a small amplitude at a reception end, and an intermediate value of the waveform is a center value between the Hi and Low voltages. On the other hand, in a transmission waveform in which the signal continues to be Low for a while before rising to Hi, and 1T after the rising, the signal falls to Low, a reception-end voltage is returned to Low partway through the rising from Low to Hi. In other words, the signal waveform in which Hi and Low are alternately switched every 1T, has a higher initial value of rise than that of the signal waveform in which the signal is held Low for a while before rising to Hi. That is, the latter has a longer time required for the waveform to rise to the threshold voltage of a reception circuit than that of the former. This appears as a timing error (=jitter) in the reception circuit. The third embodiment addresses this problem.

Figure 6:
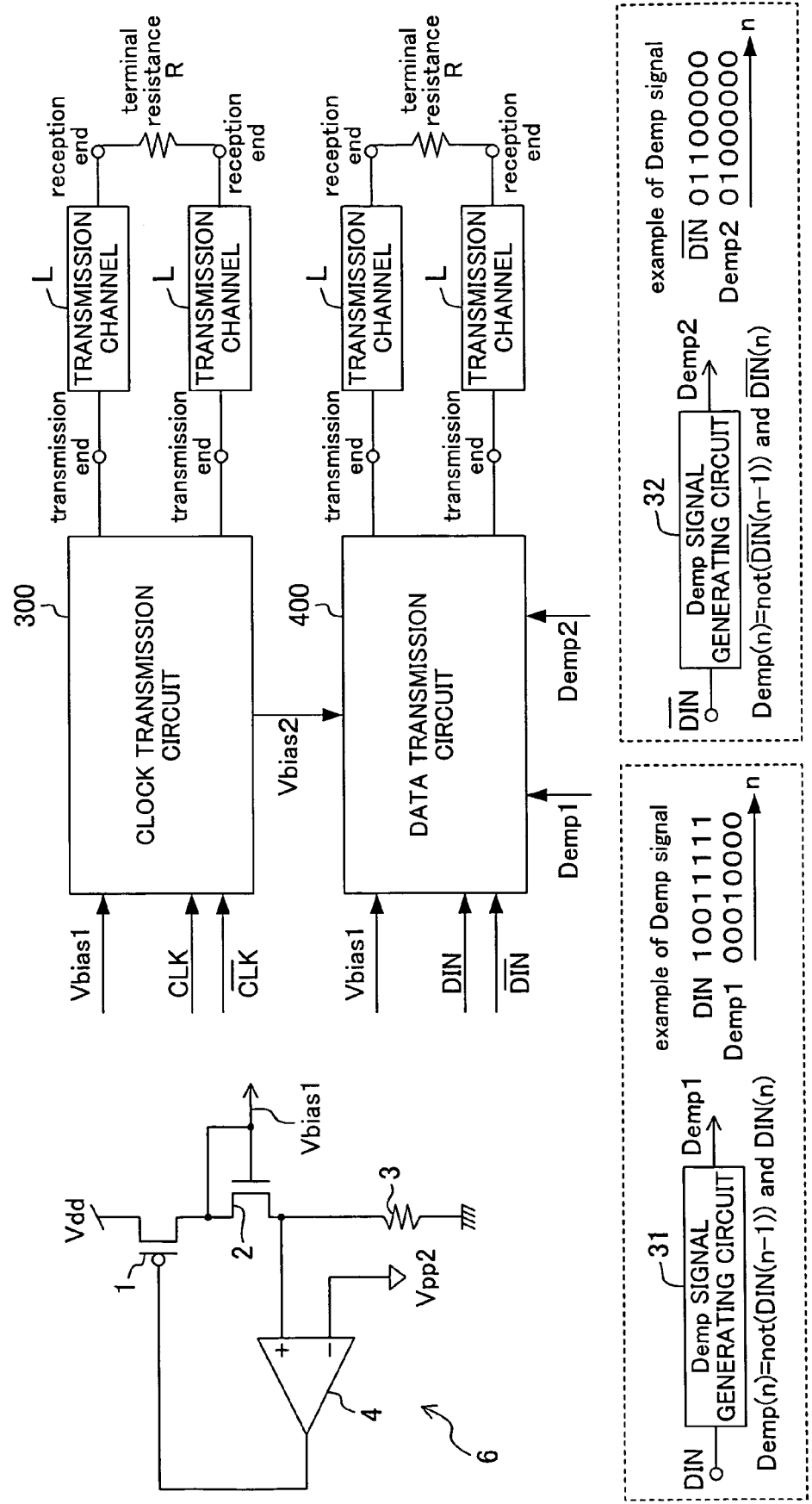
FIG. 6 is a block diagram illustrating a configuration of a signal transmission circuit according to a third embodiment of the present invention.

FIG. 6 illustrates a configuration of a signal transmission circuit according to a third embodiment of the present invention. In FIG. 6, 300 indicates a clock transmission circuit having a differential output structure, and 400 indicates a data transmission circuit having a differential output structure. A transmission channel L of FIG. 6 is assumed to have characteristics such that a signal waveform of a clock pulse sequence having a first voltage Vpp1 transmitted from the transmission end is attenuated to a second voltage Vpp2 at the reception end. Further, a terminal resistance R having a relatively large resistance value (several hundreds of ohms to several thousands of ohms) is provided at the reception end. Furthermore, in a first bias circuit 6 of this embodiment, an inverted input voltage of a differential amplifier 4 is set to be Vpp2, and a resistance value of a resistance 3 is set to be equal to the terminal resistance R.

Figure 7:
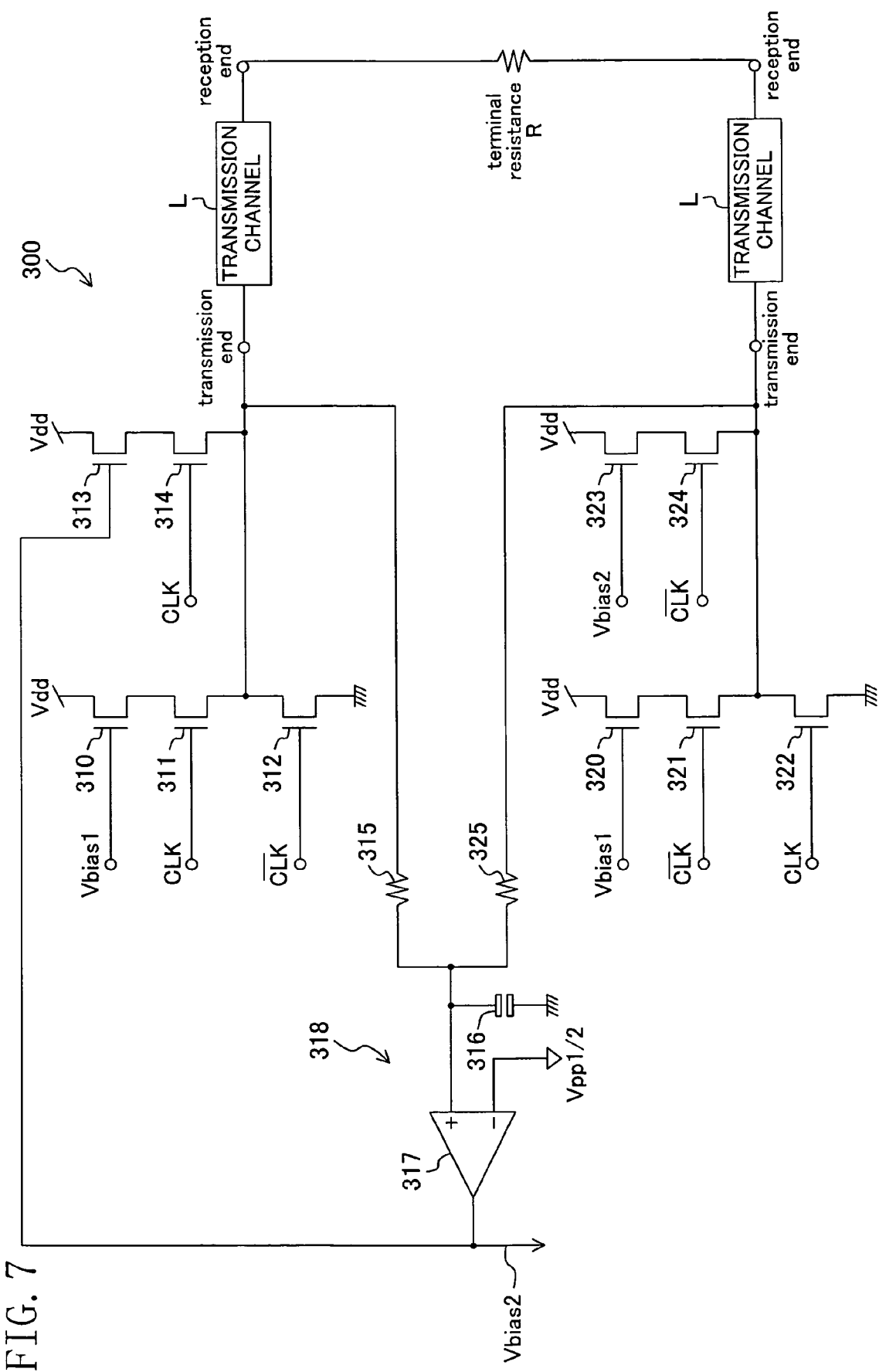
FIG. 7 is a circuit diagram illustrating a detailed configuration of a clock transmission circuit of FIG. 6.

FIG. 7 illustrates a detailed configuration of the clock transmission circuit 300 of FIG. 6. A positive phase circuit which responds to a CLK signal is composed of first and second source followers 310 and 313 and three switching transistors 311, 312 and 314. A reverse phase circuit which responds to an inverted CLK signal is composed of first and second source followers 320 and 323 and three switching transistors 321, 322 and 324. A second bias circuit 318 for generating Vbias2 is composed of resistances 315 and 325 and a capacitance 316 for using a transmission-end voltage of the positive phase circuit and a transmission-end voltage of the reverse phase circuit to detect an average voltage, and a single differential amplifier 317. The inverted input of the differential amplifier 317 is fixed to a half voltage of Vpp1.

Figure 8:
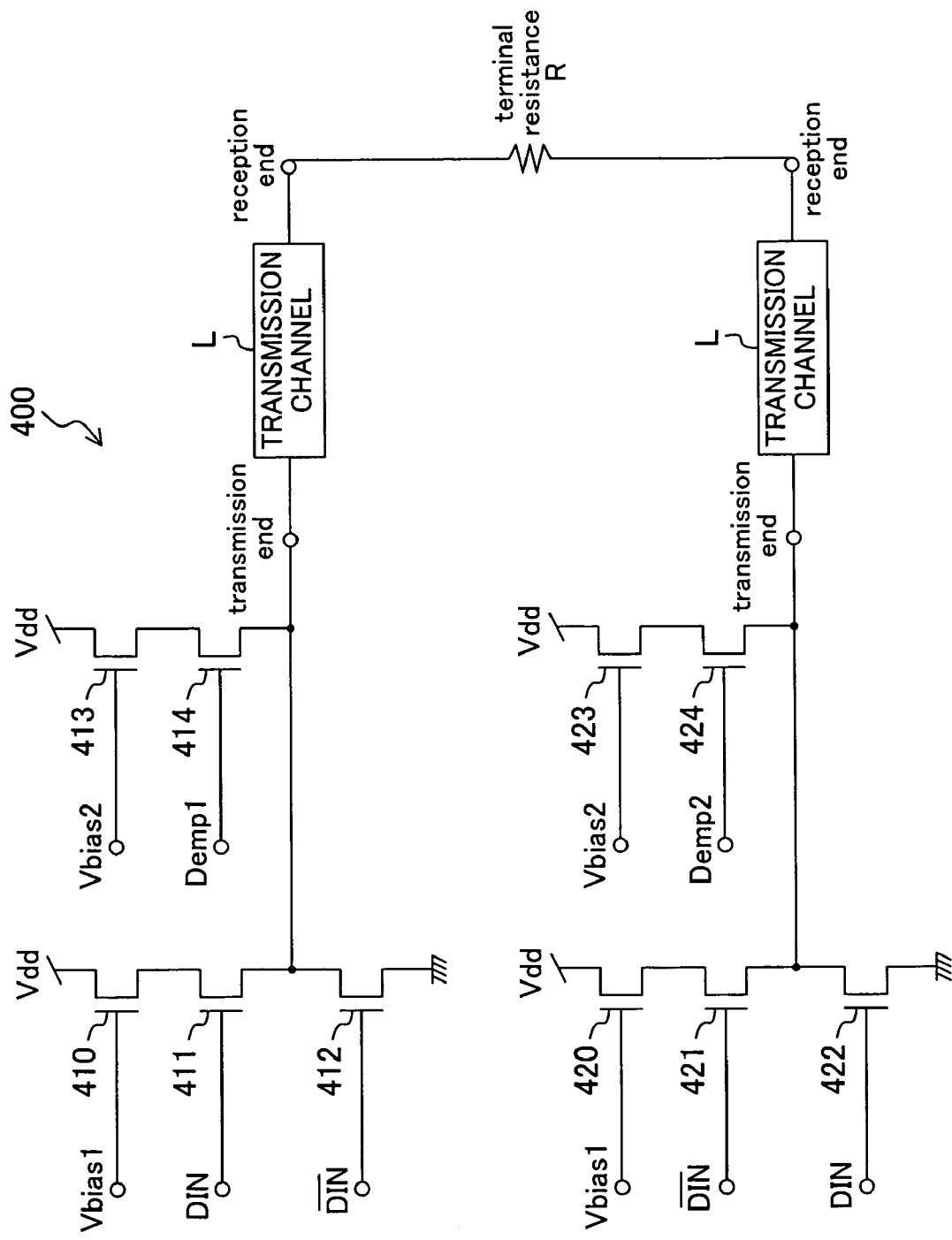
FIG. 8 is, a circuit diagram illustrating a detailed configuration of a data transmission circuit of FIG. 6.

FIG. 8 illustrates a detailed configuration of the data transmission circuit 400 of FIG. 6. A positive phase circuit which responds to a DIN signal is composed of first and second source followers 410 and 413 and three switching transistors 411, 412 and 414. A reverse phase circuit which responds to an inverted DIN signal is composed of first and second source followers 420 and 423 and three switching transistors 421, 422 and 424.

Figure 9:
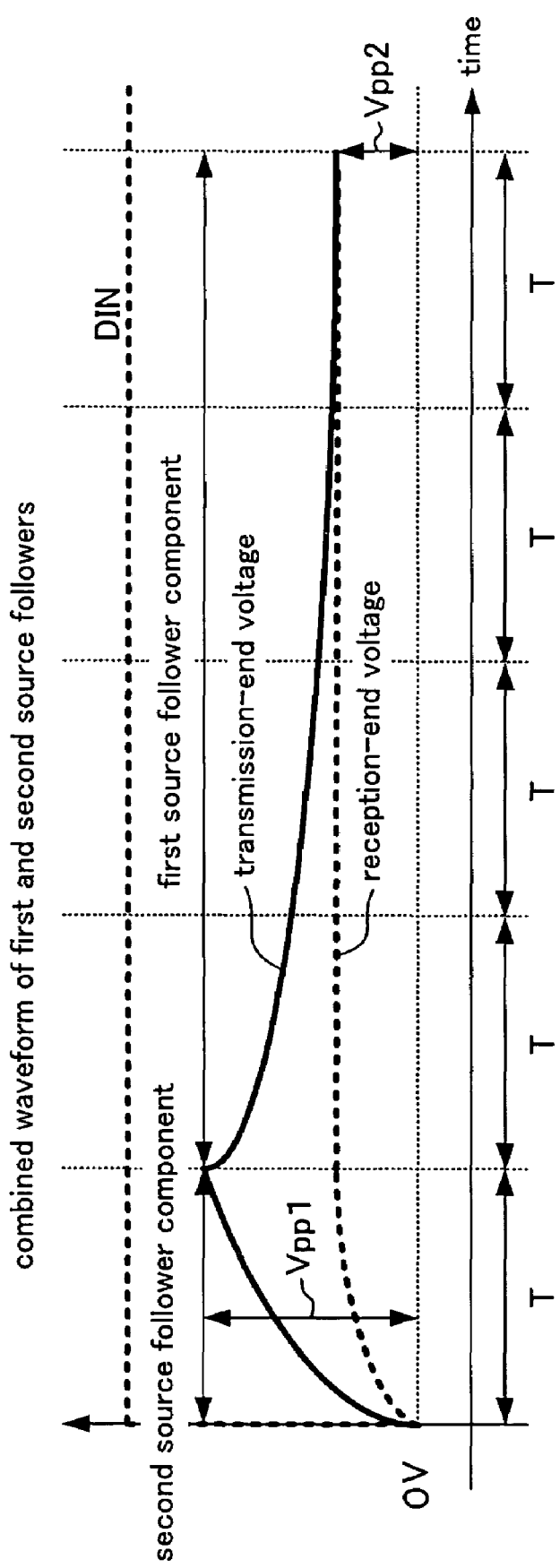
FIG. 9 is a signal waveform diagram indicating an effect of the signal transmission circuit of FIG. 6.

FIG. 9 is a signal waveform diagram illustrating an effect of the signal transmission circuit of FIG. 6. According to the configurations of FIGS. 6 to 8, Vbias1 and Vbias2 are determined so that a converged value of an output voltage of the first source followers 410 and 420 when an input data signal sequence DIN(n) is Hi, is Vpp2, and an output voltage of the second source followers 413 and 423 when an input data signal sequence DIN(n) is switched from Low to Hi, rises up to Vpp1 during a period of 1T of the input data signal sequence DIN(n). In other words, the transmission-end voltage after 1T of a continuous Hi period has passed is positively lowered to Vpp2, thereby holding a voltage amplitude of the reception end at Vpp2.

According to this embodiment, even in either the case of a signal waveform in which Hi and Low alternately switch every 1T or the case of a signal waveform in which Hi continues like a direct current, the voltage at the reception end is suppressed to Vpp2, thereby making it possible to suppress occurrence of jitter.

Note that, since the terminal resistance R of the reception end is assumed to have a relatively large resistance value, there is not a problem with power consumption due to a current flowing through the terminal resistance R.

Fourth Embodiment

When a higher-speed transmission than that of the third embodiment is desired, a surge of the reception-end voltage disadvantageously occurs due to an increase in a difference between Vpp1 and Vpp2, and a reduction in the length of 1T as compared to a discharge time of parasitic capacitance. The surge of the reception-end voltage is caused by electric charges accumulated in the parasitic capacitance of the transmission end flowing into the parasitic capacitance of the reception end. A large change in the reception-end voltage due to the surge may be a main cause for jitter. The fourth embodiment addresses this problem.

Figure 10:
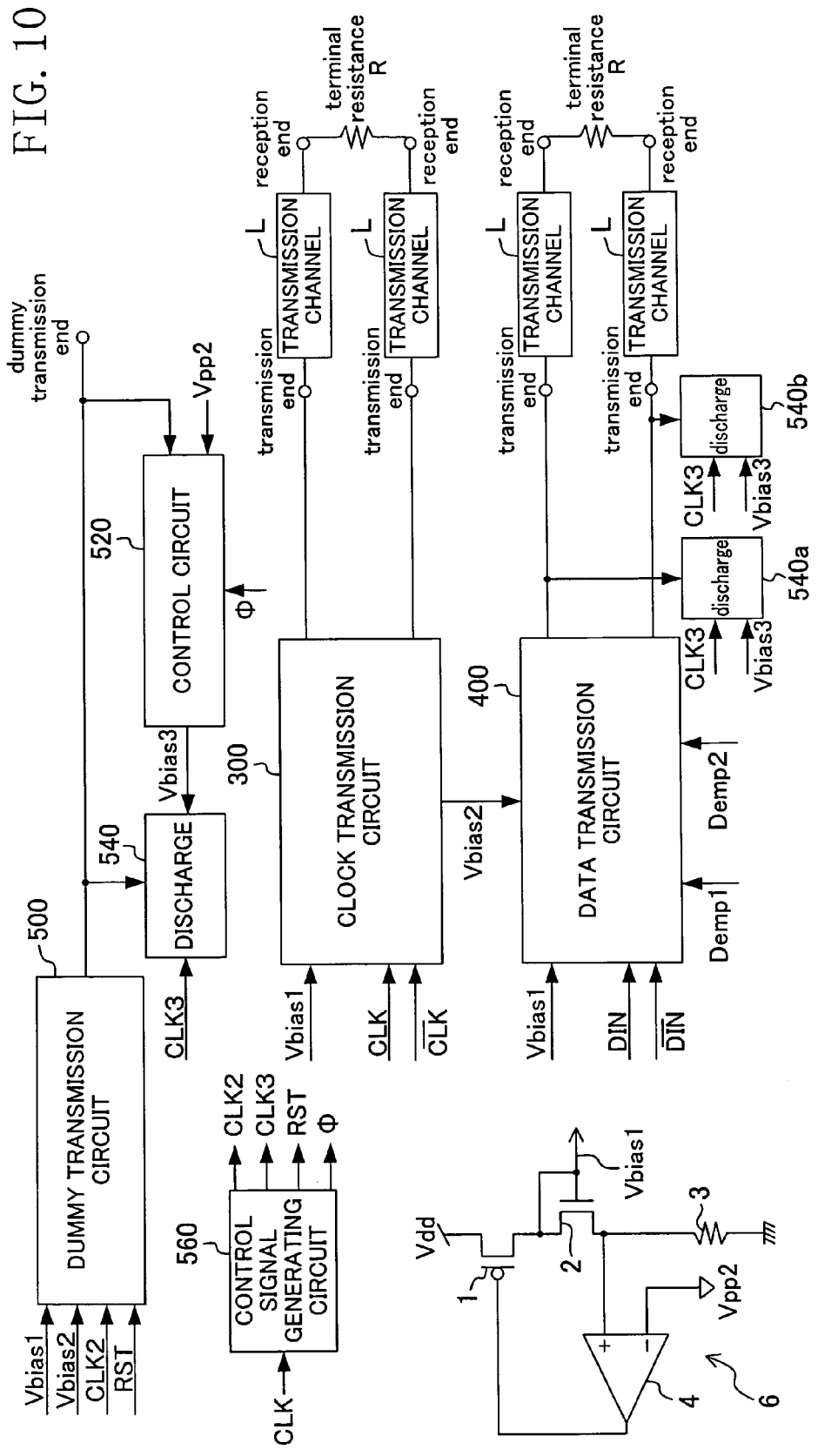
FIG. 10 is a block diagram illustrating a configuration of a signal transmission circuit according to a fourth embodiment of the present invention.

FIG. 10 illustrates a configuration of a signal transmission circuit according to the fourth embodiment of the present invention. This is the same as the data transmission circuit 400, except that discharge circuits 540*a* and 540*b* are added at the transmission end. A similar discharge circuit may be provided at the transmission end of the clock transmission circuit 300, though not illustrated. In FIG. 10, as a circuit configuration for determining discharge timing, a dummy transmission circuit 500, a control circuit 520, and a dummy discharge circuit 540 are provided. A control signal generating circuit 560 generates signals for controlling these circuits.

Figure 11:
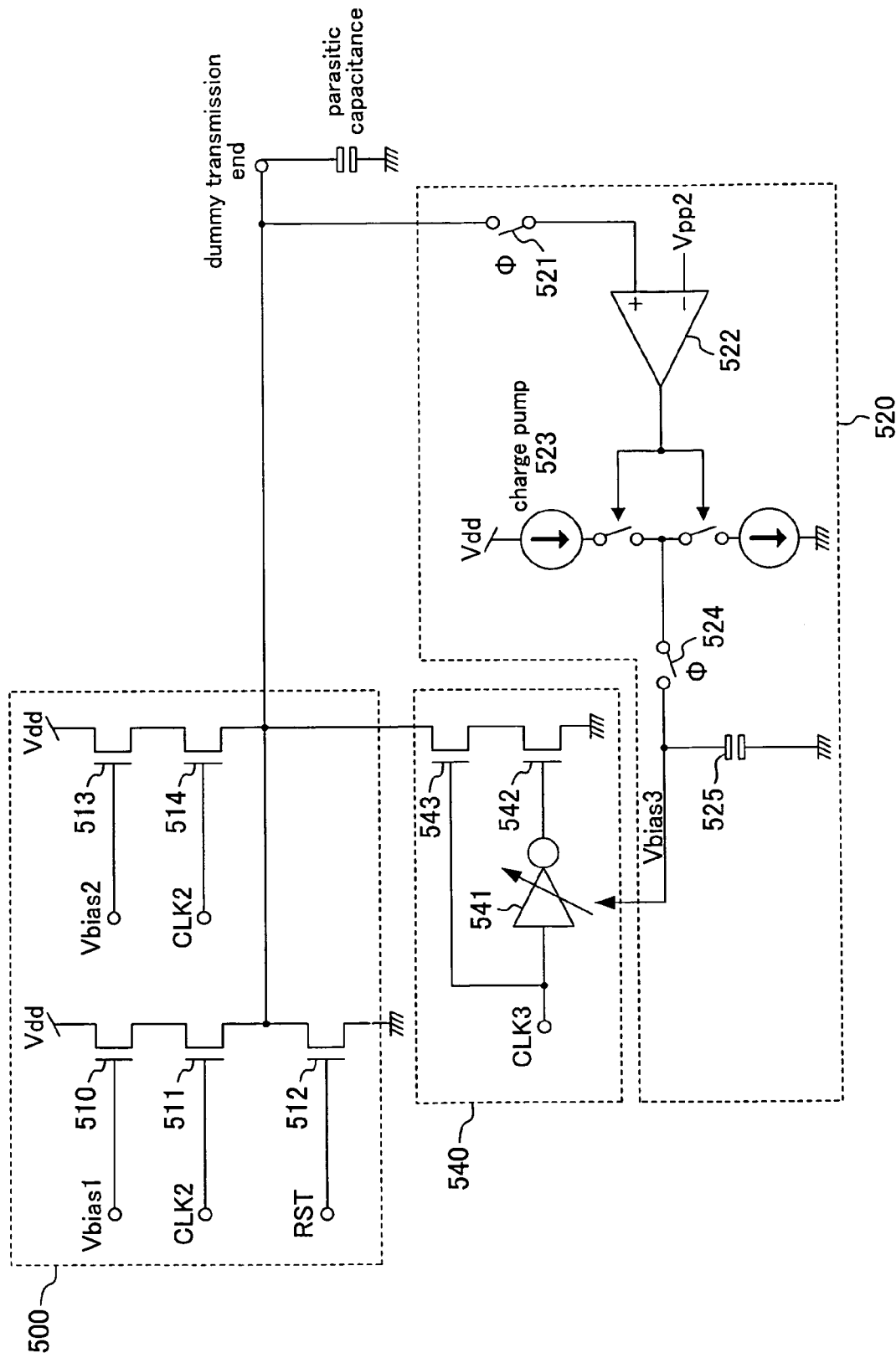
FIG. 11 is a circuit diagram illustrating a detailed configuration of each of a dummy transmission circuit, a control circuit and a dummy discharge circuit of FIG. 10.

FIG. 11 illustrates a detailed configuration of each of the dummy transmission circuit 500, the control circuit 520 and the dummy discharge circuit 540 of FIG. 10. The dummy transmission circuit 500 comprises first and second source followers 510 and 513 each composed of an N-channel MOS transistor, and first, second and third switching transistors 511, 512 and 514 each composed of an N-channel MOS transistor. The drain of the first source follower 510 is connected to a power supply Vdd, and the source of the first source follower 510 is connected via the first switching transistor 511 to a dummy transmission end. The drain of the second source follower 513 is connected to the power supply Vdd, and the source of the second source follower 513 is connected via the third switching transistor 514 to the dummy transmission end. The dummy transmission end is connected via the second switching transistor 512 to the ground. Vbias1 is applied to the gate of the first source follower 510, and Vbias2 is applied to the gate of the second source follower 513. A CLK2 signal is supplied to the gates of the first and third switching transistors 511 and 514, and an RST signal is supplied to the gate of the second switching transistor 512.

The control circuit 520 is composed of two switches 521 and 524 whose opening/closing is controlled using a Φ signal, a comparator 522 for comparing a voltage at the dummy transmission end with Vpp2, a charge pump 523, and a control capacitance 525, and outputs a control voltage Vbias3. The dummy discharge circuit 540 is composed of a variable delay inverter 541 which receives the supply of Vbias3, and two switching transistors 542 and 543, so as to respond to a CLK3 signal to extract electric charges from the dummy transmission end. The discharge circuits 540a and 540b of FIG. 10 have an internal configuration similar to that of the dummy discharge circuit 540 of FIG. 11.

Figure 12:
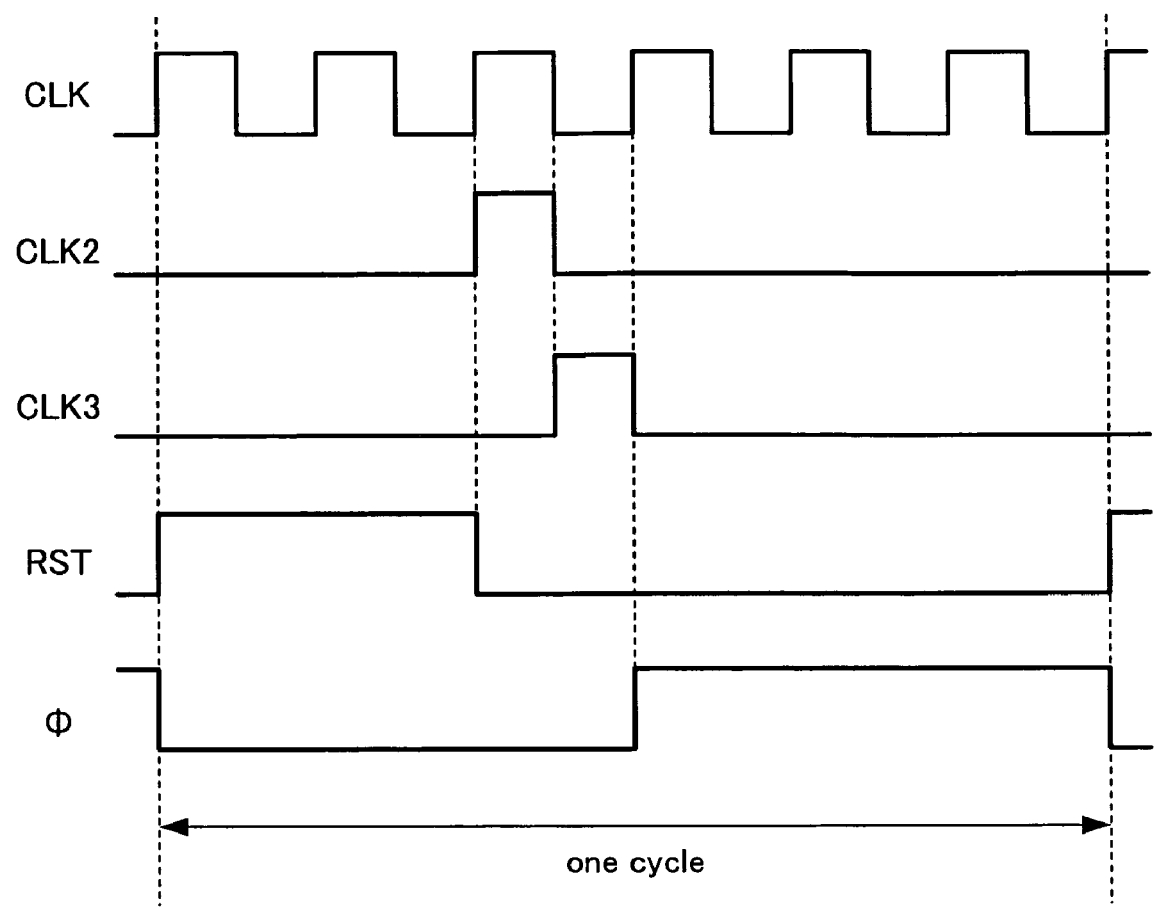
FIG. 12 is a timing diagram illustrating an operation of a control signal generating circuit of FIG. 10.

FIG. 12 is a timing diagram illustrating an operation of the control signal generating circuit 560 of FIG. 10. The control signal generating circuit 560 generates the CLK2 signal, the CLK3 signal, the RST signal, and the Φ signal based on the CLK signal.

The dummy transmission circuit 500 is driven using the CLK2 signal which is a single pulse. As a result, the parasitic capacitance of the dummy transmission end is charged so that a voltage applied between both the ends thereof becomes Vpp1. Based on the CLK3 signal which is a single pulse immediately after the CLK2 signal, electric charges are extracted from the parasitic capacitance of the dummy transmission end by the dummy discharge circuit 540 whose ON-time is determined by the variable delay inverter 541. Thereafter, a signal path of the control circuit 520 is formed by the Φ signal which rises to Hi after the CLK3 signal. The comparator 522 compares the voltage of the parasitic capacitance of the dummy transmission end with Vpp2, and outputs Low when the former is higher, and conversely, Hi when the latter is higher. The charge pump 523 extracts electric charges from the control capacitance 525 with a predetermined current when Low is input, and charges the control capacitance 525 with the same current when Hi is input. The variable delay inverter 541 increases the delay with a decrease in Vbias3, and conversely, decreases the delay with an increase in Vbias3. The delay of the variable delay inverter 541 is the ON-time of the dummy discharge circuit 540. Note that, in order to cause the voltage of the dummy transmission end to be 0, the RST signal is previously caused to rise to Hi at the time when the Φ signal goes to Low.

As described above, the control circuit 520 compares the voltage of the parasitic capacitance of the dummy transmission end driven by the dummy transmission circuit 500 with Vpp2, and based on the result of the comparison, operates along with the dummy discharge circuit 540 so as to control electric charge amount adjustment times for both the data transmission end and the dummy transmission end. Specifically, the control circuit 520 compares the voltage of the parasitic capacitance of the dummy transmission end with Vpp2 using the comparator 522, and as a result, if the reception-end voltage is high, performs a control to elongate the discharge time, and if otherwise, performs a control to shorten the discharge time. The transmission-end voltage immediately after discharge is gradually converged to Vpp2 by charging the transmission-end voltage to Vpp1 each time and repeatedly performing such a control. Vbias3 in this time is supplied to the discharge circuits 540a and 540b added to the data transmission circuit 400, thereby making it possible to suppress the surge of the reception-end voltage.

Figure 13:
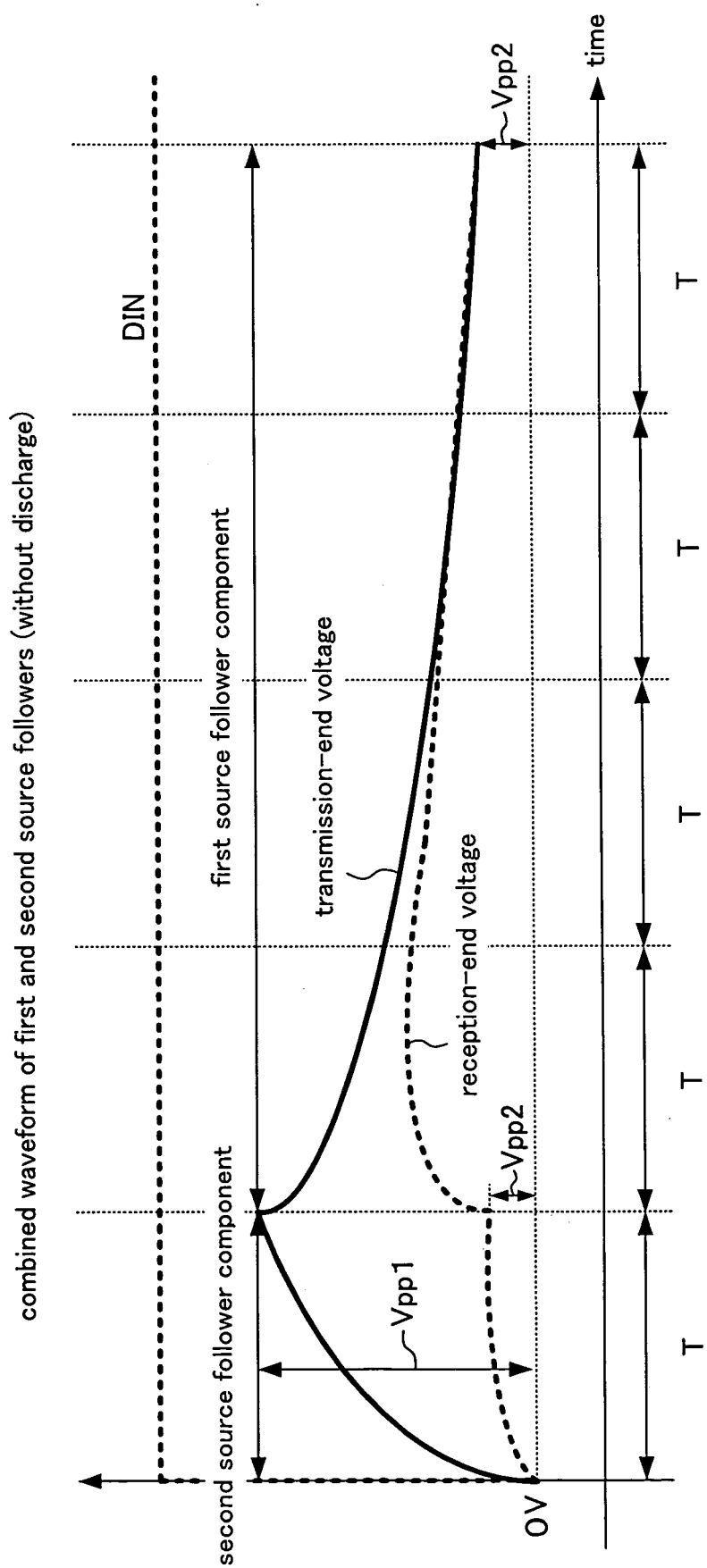
FIG. 13 is a signal waveform diagram when discharge circuits of FIG. 10 are not provided.

FIG. 13 is a signal waveform diagram when the discharge circuits 540a and 540b are not provided in FIG. 10. As can be seen, the reception-end voltage surges up to a voltage higher than Vpp2.

Figure 14:
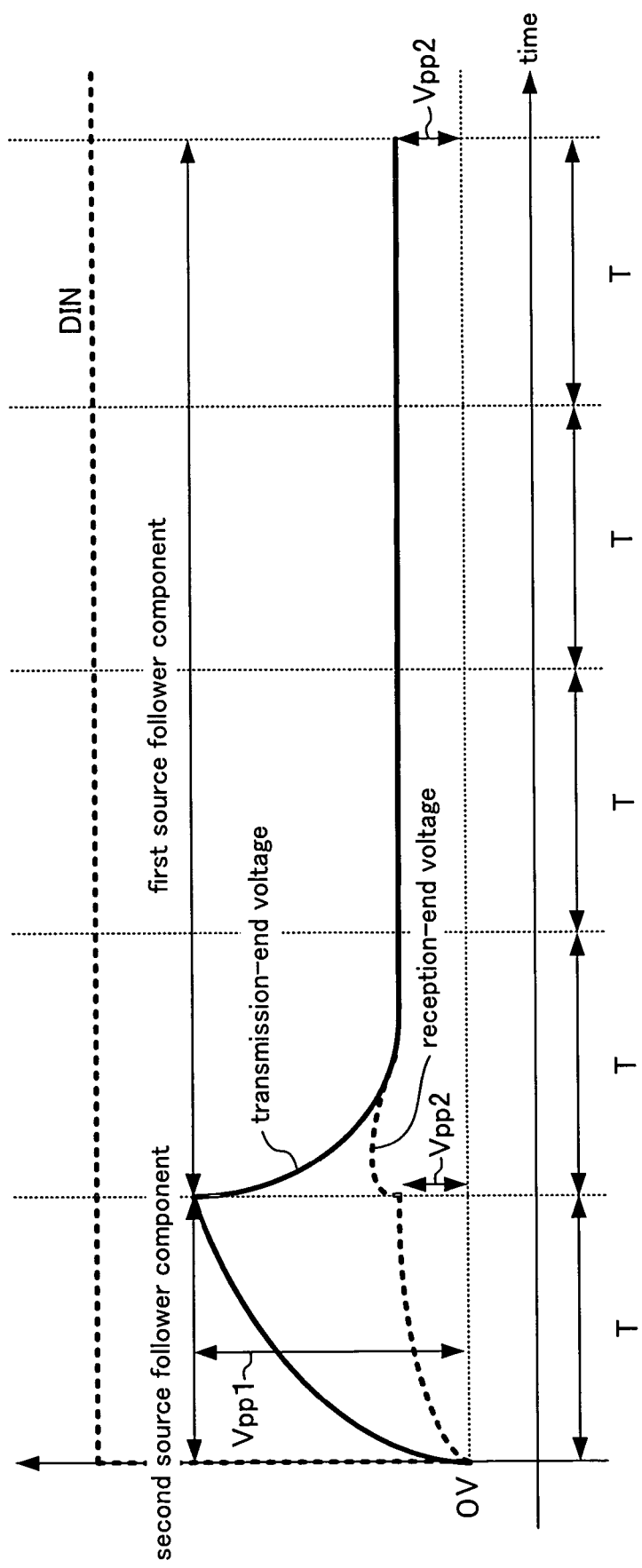
FIG. 14 is a signal waveform diagram illustrating an effect of the signal transmission circuit of FIG. 10.

FIG. 14 is a signal waveform diagram illustrating an effect of the signal transmission circuit of FIG. 10. As illustrated in FIG. 14, when a current path by which electric charges are directly discharged from the transmission end to the ground through the discharge circuits 540a and 540b is formed so that electric charges are extracted from the transmission end immediately after the second source followers in the data transmission circuit 400 drives the transmission channel L so as not to prevent electric charges of the transmission-end parasitic capacitance from flowing into the reception end, it is possible to cause substantially all currents flowing into the reception end to flow into the ground of the transmission end, thereby making it possible to prevent the surge of the reception-end voltage. Also, according to FIG. 14, the surge of the reception-end voltage is converged to Vpp2 within 1T. Therefore, even in either the case of a signal waveform in which Hi and Low alternately switch every 1T or the case of a signal waveform in which Hi continues like a direct current, the voltage at the reception end is suppressed to Vpp2, thereby making it possible to suppress occurrence of jitter.

Note that a configuration compliment to that of each of the above-described embodiments may be used. Specifically, the first and second source followers are each composed of a P-channel MOS transistor, and 0 and 1 of the DIN signal and the Demp signal are interchanged.

As has been described above, the signal transmission circuit of the present invention overcomes a disadvantageous reduction in drive performance in the conventional single source follower, achieves high-speed transmission while holding low power consumption of voltage-mode transmission, and is useful as a low-power-consumption, high-speed interface technique between semiconductor integrated circuits or the like.

For example, since a driver for a liquid crystal panel is used to drive a high-resistance conductor formed on a glass substrate, the driver needs to drive a transmission channel having a relatively low cut-off frequency of about 100 MHz. The present invention can be preferably applied to high-speed signal transmission in such a case.

What is claimed is:

1. A signal transmission circuit for driving a transmission channel in a voltage mode, comprising:
   first and second source followers each composed of a MOS transistor;
   a first bias circuit for applying a first bias voltage to the first source follower;
   a second bias circuit for applying a second bias voltage different from the first bias voltage to the second source follower; and
   a circuit for generating an emphasis data signal indicating a period of one clock from a time when an input data signal goes from a first logical value to a second logical value, wherein the first source follower drives the transmission channel, depending on the input data signal, and the second source follower drives the transmission channel, depending on the emphasis data signal.

2. The signal transmission circuit of claim 1, wherein the first and second bias voltages are determined so that a converged value of an output voltage of the first source follower when the input data signal goes from the first logical value to the second logical value, becomes substantially equal to an output voltage of the second source follower at a time when a period of one clock has passed since the input data signal went from the first logical value to the second logical value.

3. The signal transmission circuit of claim 2, wherein the second bias circuit determines the second bias voltage so that a half of the converged value of the output voltage of the first source follower when the input data signal goes from the first logical value to the second logical value, becomes substantially equal to an average value of an output voltage of a clock transmission circuit.

4. The signal transmission circuit of claim 1, further comprising:
a data transmission circuit having a differential output structure.

5. The signal transmission circuit of claim 4, wherein the transmission channel has a terminal resistance having a property that a signal waveform in which a clock pulse sequence having a first voltage is transmitted from a transmission end is attenuated to a second voltage at a reception end, and having a relatively large resistance value at the reception end; and
the first and second bias voltages are determined so that a converged value of an output voltage of the first source follower when the input data signal goes from the first logical value to the second logical value, becomes substantially equal to the second voltage, and an output voltage of the second source follower at a time when a period of one clock has passed since the input data signal went from the first logical value to the second logical value, becomes substantially equal to the first voltage.

6. The signal transmission circuit of claim 5, wherein the data transmission circuit has a circuit for reducing an electric charge amount of the transmission end immediately after the second source follower drives the transmission channel.

7. The signal transmission circuit of claim 6, further comprising:
a circuit for comparing a voltage of a dummy transmission end driven by a dummy transmission circuit with the second voltage, and depending on a result of the comparison, controlling electric charge amount adjustment times of both the transmission end and the dummy transmission end.

8. A signal transmission method in which a transmission channel is driven in a voltage mode by first and second source followers each composed of a MOS transistor and to which different bias voltages are applied, the method comprising:
a first step of driving the transmission channel to a predetermined voltage using the second source follower during a period of one clock from a time when an input data signal goes from a first logical value to a second logical value; and
a second step of driving the transmission channel with the predetermined voltage using the first source follower after the first step.

* * * * *